United States Patent
Leidy et al.

[11] Patent Number: 5,804,503
[45] Date of Patent: Sep. 8, 1998

[54] METHOD AND STRUCTURE FOR REDUCING MICROELECTRONIC SHORT CIRCUITS USING SPIN-ON GLASS AS PART OF THE INTERLAYER DIELECTRIC

[75] Inventors: Robert Kenneth Leidy, Burlington; Jeffrey Scott Miller, Colchester; Jon A. Patrick, Jeffersonville, all of Vt.

[73] Assignee: International Business Machines Corporation, Armonk, N.Y.

[21] Appl. No.: 685,650

[22] Filed: Jul. 24, 1996

Related U.S. Application Data

[62] Division of Ser. No. 426,303, Apr. 21, 1995, Pat. No. 5,710,460.

[51] Int. Cl.$^6$ .................................................. H01L 21/44
[52] U.S. Cl. .......................... 438/633; 438/692; 438/637
[58] Field of Search ................................ 437/195, 228, 437/235, 238; 156/643.1; 438/626, 623, 624, 633, 637, 692, 725

[56] References Cited

U.S. PATENT DOCUMENTS

| | | | |
|---|---|---|---|
| 4,902,533 | 2/1990 | White et al. ........................ | 427/99 |
| 4,906,592 | 3/1990 | Merenda et al. . | |
| 4,962,063 | 10/1990 | Maydan et al. ........................ | 437/228 |
| 4,983,546 | 1/1991 | Hyun et al. ........................ | 437/231 |
| 5,264,074 | 11/1993 | Muroyama et al. ................... | 156/632 |
| 5,266,525 | 11/1993 | Morozumi ........................... | 437/195 |
| 5,302,233 | 4/1994 | Kim et al. . | |
| 5,371,047 | 12/1994 | Greco et al. ........................ | 437/238 |
| 5,395,796 | 3/1995 | Haskall et al. ..................... | 437/195 |

*Primary Examiner*—Caridad Everhart
*Attorney, Agent, or Firm*—Heslin & Rothenberg, P.C.

[57] ABSTRACT

A method and structure for reducing short circuits in semiconductor devices is disclosed. A three layer interlevel dielectric structure is formed over a semiconductor substrate, which typically comprises a first metallization level, M1. The three layer dielectric includes a first insulator layer, a middle spin-on glass (SOG) layer, and a top second insulator layer. The spin-on glass fills defects in the surface of the first insulator layer created during planarization using chemical-mechanical-polishing (CMP). Prior to deposition of the second insulator, a first via is etched through the SOG film and the first insulator layer to expose a portion of the semiconductor substrate, typically a conductive metal. A conductive metal is deposited into the first via and planarized to form a metal interconnection stud. Because the surface defects are filled and covered with the SOG film, none of the deposited metal enters the defects, and short circuits with the stud are greatly reduced. The second insulator layer is deposited onto the SOG film and the end of the metal interconnection stud. A second via is formed through the second insulator material to the stud end, and the second via is available for subsequent deposition of a conductive metal to provide electrical connection to the semiconductor substrate.

9 Claims, 1 Drawing Sheet

METHOD AND STRUCTURE FOR REDUCING MICROELECTRONIC SHORT CIRCUITS USING SPIN-ON GLASS AS PART OF THE INTERLAYER DIELECTRIC

This application is a division of application Ser. No. 08/426,303 filed Apr. 21, 1995 which application is now U.S. Pat. No. 5,710,460.

FIELD OF THE INVENTION

This invention relates generally to a semiconductor interlayer dielectric structure and a method for producing the structure, and more particularly to a structure and method for reducing short circuits within semiconductor devices using spin on glass as part of the interlayer dielectric material.

BACKGROUND OF THE INVENTION

A common practice in the manufacture of microelectronic devices and integrated circuits is to protect the semiconductor surface, as well as the metal layer surfaces, with a covering insulator layer. These insulator layers are also referred to as dielectric layers or passivation layers. Modern microelectronic semiconductor devices often require multiple layers of metal, one crossing over the other and separated by an interlayer dielectric material, often referred to as an intermetal dielectric layer. Interlayer connection points are provided through openings, or vias (contact holes), formed for that purpose in the intermetal dielectric layers.

It is common practice to planarize the intermetal dielectric layer using chemical-mechanical-polishing (CMP) techniques in order to provide a smooth planar surface upon which to apply the next architectural level of material. A planarized surface provides a constant depth of focus for exposing patterns in a photolithography emulsion. However, when CMP is used in planarization processes on semiconductor devices, defects such as scratches are formed in the surface of the interlayer dielectric material. Subsequent metal deposition with tungsten, for example, fills not only the vias formed in the interlayer dielectric material, but also these scratches. Thus, short circuits within each metallization layer of a semiconductor microelectronics device are common. Test yield problems, line scrap problems, and low product yield of fabricated semiconductor wafers result, and many devices must be discarded.

Current semiconductor chip manufacturing processes avoid the problems associated with CMP and the resulting scratches left in the insulator layer by double polishing. The intermetal dielectric layer, which is generally an oxide, is planarized using CMP, vias are etched through the oxide, and metal is deposited onto the oxide layer and into the vias and the scratches. The metal is removed from the interdielectric layer by CMP, and a second oxide CMP polishing step is necessary to remove the metal-filled scratches in the insulator. The amount of dielectric material between wiring levels must therefore be overdeposited in order for the final interlayer dielectric thickness to be within the range required by circuitry design specifications. Double polishing is very expensive because of the large amount of sacrificial insulator needed.

A need therefore exists for an inexpensive and practical method and structure which improve wafer yield loss by reducing metallization layer short circuits in semiconductor devices due to conductive metal left in CMP scratches in the interlayer dielectric surface. In particular, a method and structure are needed which permit the use of CMP for planarizing the surface of an interlayer dielectric material while avoiding the associated metal shorting problems caused by the CMP defects in the insulator surface. Such a method should be inexpensive and easy to perform.

SUMMARY OF THE INVENTION

Briefly, one aspect of the present invention relates to a method for manufacturing a semiconductor device that greatly reduces metallization level short circuits by providing a three layer dielectric between the semiconductor substrate and an overlying metallization layer. A middle polymeric layer covers a first insulator layer overlying the semiconductor substrate. A first via extending vertically from the top surface of the polymeric film through the underlying insulator layer and exposing a portion of the semiconductor substrate is formed. Deposition of a conductive metal fills the first via to form a metal interconnection stud. The conductive metal is planarized creating a metal interconnection stud end that is planar with the top surface of the polymeric film. The stud end provides a contact for electrical connection to the semiconductor substrate. A second insulator layer, which is the third layer of the interlayer dielectric of the present invention, is deposited over the polymeric film and the end of the metal interconnection stud. Finally, a second via is formed by removing a portion of the second insulator layer that directly overlies the metal interconnection stud end. The second via extends through the second insulator layer to the stud end and preferably exposes only the end of the metal interconnection stud and none of the polymeric film. The second via is preferably fully landed on the end of the stud, and the diameter of the second via is generally less than that of the first via. The second via is available for subsequent deposition therein of another conductive metal.

In another aspect, the present invention relates to a semiconductor device having a three layer interdielectric structure. The device comprises a semiconductor substrate underlying a layer of insulating material which forms a first insulator layer. A polymeric film having a top surface covers the first insulator layer. At least one metal interconnection stud comprising a conductive metal extends from the top surface of the polymeric layer, through the polymeric film and the first insulator layer to the semiconductor substrate. Each metal interconnection stud has an end that is planar with the top surface of the polymeric film. A second insulator layer covers the top surface of the polymeric film and a portion of each metal interconnection stud end. At least one second via, each second via corresponding to a metal interconnection stud end, extends from the top surface of the second insulator layer to the corresponding stud end. The second via is preferably fully landed on the end of the stud such that only the uncovered portion of each stud end is exposed. The diameter of the second via is generally less than that of the first via.

Typically, the semiconductor substrate includes an electrically conductive metal patterned in the top surface to form a layer of metallization interconnect or first metallization level, M1. In addition, the semiconductor substrate may include a conductive metal coating thereon which contacts the first metallization level, M1. In such cases, the interlayer dielectric of the present invention is disposed between first metallization level, M1, and an overlying second metallization level, M2. The metal interconnection stud and the second via provide electrical connection between the metallization layers. However, if the semiconductor substrate does not include metallization level, M1, or the conductive metal coating, then the metal interconnection stud would then contact doped or undoped semiconductor. The semiconductor substrate layers underlying M1, such as field oxide, implanted or diffused junctions, or polysilicon may all be formed by any of the well-known deposition and etching processes for microelectronics.

The first and second insulator layers are generally oxides such as silicon dioxide, doped with phosphorous or boron, or undoped. Typically, the surface of the first insulator layer has at least one defect therein caused by chemical-mechanical-polishing (CMP) planarization. The polymeric film fills the defects and avoids the short circuiting problems of current fabrication processes where the defects are filled with a conductive metal deposited to fill the first vias. The polymeric film is preferably a spin-on-glass formed upon the curing of a deposited aminosilane, for example. Curing is usually a two step heat treatment that drives off solvents and polymerizes the material. The polymeric film remains on the first insulator layer and becomes part of the interlayer dielectric structure as part of the insulating material.

The conductive metal is preferably tungsten or a titanium/tungsten alloy, both of which are generally deposited by chemical vapor deposition. Aluminum may also be used and is deposited by sputtering.

The method and structure of the present invention provide a significant improvement over current semiconductor devices and the fabrication methods by reducing short circuits within the interlayer dielectric separating metallization levels. Thus, wafer yield is improved in the semiconductor chip fabrication process at the original equipment manufacture level. By filling CMP defects in the surface of interlayer dielectrics with a polymer such as spin-on glass, only the etched vias are filled with conductive metal. Therefore, chemical-mechanical-polishing, which is the preferred process for planarizing the underlying intermetal dielectric layer, may be used without the associated shorting problems.

The structure and method of the present invention are also advantageous because, unlike the current practice of over-depositing insulating material, large amounts of sacrificial dielectric need not be used. Thus, the structure and method of the present invention provide a significant savings in the cost of semiconductor device manufacture.

Unlike other manufacturing processes that utilize spin-on glass to aid in planarization by filling the topographical circuitry irregularities in the insulator, the spin-on glass interlayer of the present invention covers the entire surface of the interlevel dielectric, except where metallization vias have been etched through it. The spin-on glass film remains on the completed semiconductor structure and is used as the middle layer of a three layer interlevel dielectric. Thus, an additional process step is not needed to remove excess spin-on glass, making the method of the present invention simpler and easier.

The foregoing and other objects, features and advantages of the invention will be apparent from the following more particular description of the preferred embodiment of the invention as illustrated in the accompanying drawing.

BEST MODE FOR CARRYING OUT THE INVENTION

As noted, the present invention provides a method and structure for reducing semiconductor short circuits within a semiconductor device due to conductive metal residing in surface defects of an intermetal dielectric layer. In particular, a three layer dielectric atop a semiconductor substrate is provided which comprises an insulator or dielectric, a polymeric film theron, and a second insulator on the polymeric film. The polymeric film is preferably a spin-on glass (SOG) applied to the first interlayer diectric. The SOG fills any defects or scratches created by CMP planarization that may exist in the first dielectric layer and remains on the surface as part of the final interlayer dielectric structure. A metallization via is etched through the SOG layer and the underlying insulator and is subsequently filled with metal to form a metal interconnection stud contacting the underlying semiconductor substrate. A second insulator is then deposited onto the SOG layer, and a second via is etched through the second insulator. The second via exposes only the end of the metal interconnection stud and creates a contact hole for subsequent deposition of a conductive metal. Electrical connection with a metallization level, M1, for example, patterned in the semiconductor substrate can then be made through the second via with a second metallization level, M2, subsequently patterned over the second insulator layer.

Figure 1:
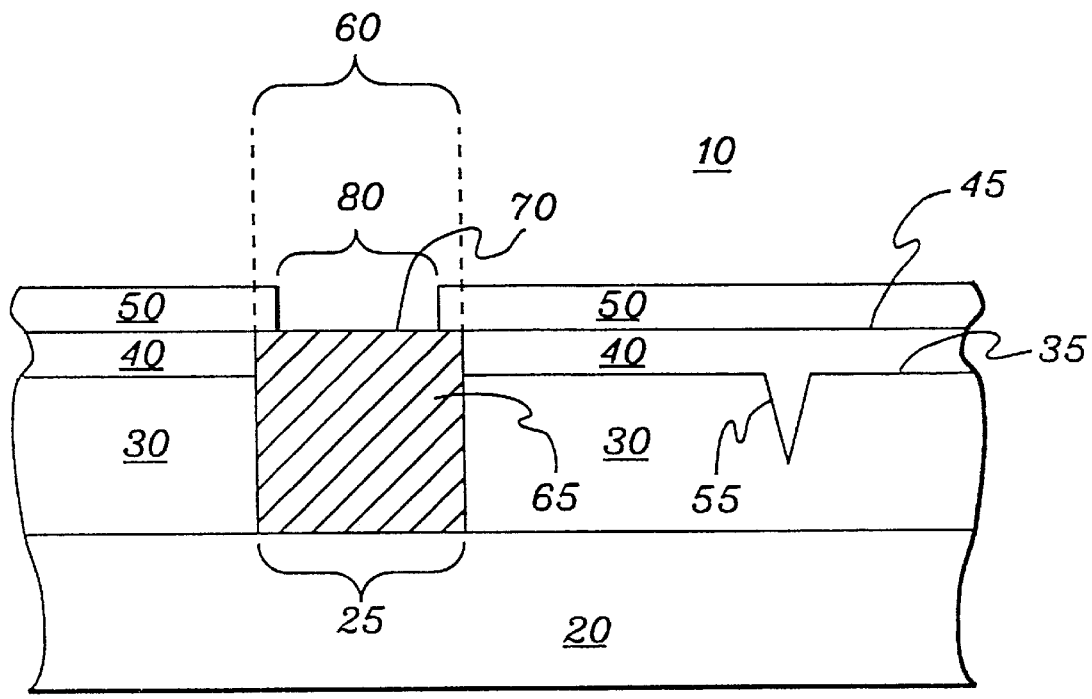
FIG. 1 is a cross-sectional view of the preferred embodiment of a semiconductor device having a three layer interlevel dielectric structure according to the method of the present invention.
Figure 2:
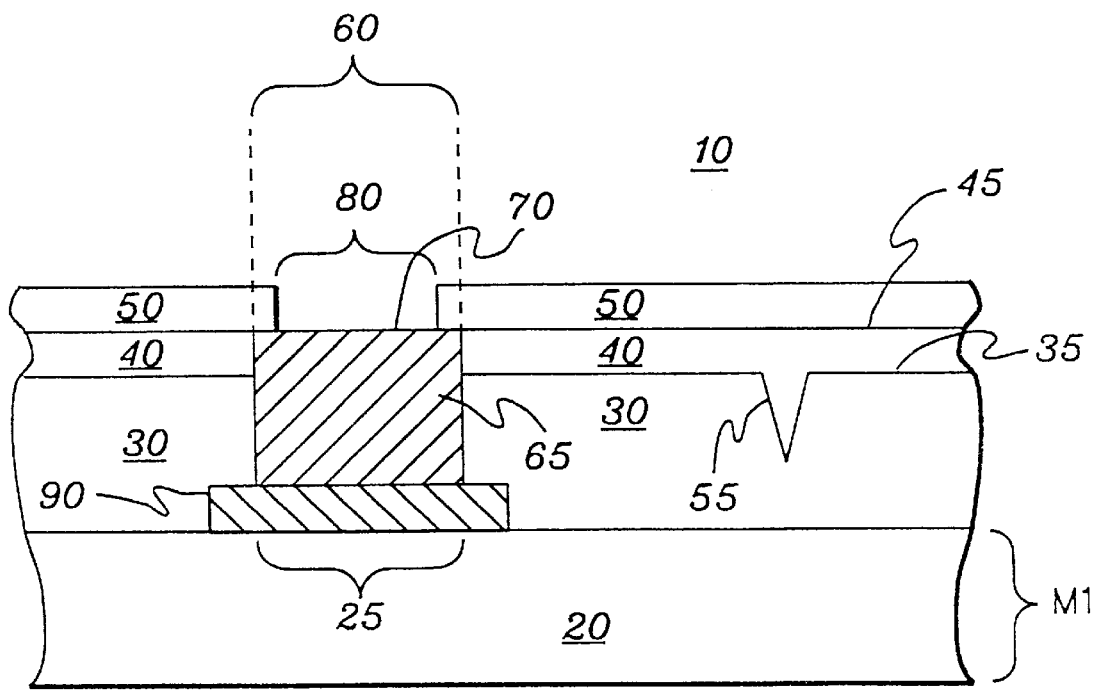
FIG. 2 is the semiconductor device of FIG. 1 with an additional electrically conductive metal coating included as part of the semiconductor substrate.

Reference should now be made to the drawings in which the same reference numbers are used throughout to designate the same components. FIG. 1 is a cross section of a portion 10 of a semiconductor device having a three layer interlevel dielectric structure, illustrating a preferred embodiment of the present invention is illustrated. FIG. 2 illustrates the device with an additional electrically conductive metal coating included as part of the semiconductor substrate. Methods in accordance with the present invention are described below in detail with reference to FIGS. 1 and 2. Each processing step described herein may be performed by standard chip or wafer level processing as will be apparent to those skilled in the semiconductor fabrication art.

The three layer interlevel dielectric of the present invention comprises first insulator layer 30, polymeric film 40, and second insulator layer 50 and is typically disposed between layers of metal interconnect. Initially, semiconductor substrate 20 is provided in which a conductive metal such as aluminum, tungsten or an alloy of titanium and tungsten may be patterned, for example, to form a conductive first metallization level, M1. However, the semiconductor substrate need not include the first level of metallization, and the three layer dielectric of the present invention would then separate the semiconductor substrate from an overlying metallization level. As used herein, the term "semiconductor substrate" includes a semiconductor having electrically conductive metal coating 90 thereon as shown in FIG. 2 as well as a semiconductor without a conductive metal coating as shown in FIG. 1. The underlying foundation layers such as field oxide, implanted and diffused junctions, or polysilicon, for example, may all be formed using well-known deposition and etching techniques.

As used herein, the terms "insulating material," "insulator," "dielectric," "interlayer dielectric," "interlevel dielectric" and "intermetal dielectric," refer to non-electrically conductive materials that physically and electrically isolate conducting metal layers or lines from each other. The three layer dielectric structure of the present invention is generally referred to as an interlayer dielectric.

However, because this structure is most often used between metal layers, it is also referred to herein as an intermetal dielectric.

An insulating material, such as an oxide, conventionally deposited onto semiconductor substrate 20 forms first insulator layer 30. Preferably, oxides, which have a low dielectric constant and remain stable at high temperatures, are used to form first insulator layer 30. The preferable insulating material used when the semiconductor device comprises tungsten metallurgy is silicon dioxide, which may or may not be doped with boron or phosphorous or a combination thereof. Polyimides may be used if the metallurgy of the semiconductor device comprises aluminum because neither aluminum nor polyimide can withstand high temperatures. Other dielectrics such as silicon nitride, which has a high dielectric constant, may be used, but generally less frequently.

In semiconductor fabrication, first insulator layer 30 is conventionally planarized using the method of chemical-mechanical-polishing (CMP) to form planar top surface 35. As used herein, the term "planar" refers to a surface having little or no irregular topography thereon or having topographical irregularities within an acceptable measurable range which depends on the substrate and subsequent processing steps to be employed. For example, planar first insulator layer top surface 35 would typically have a step height of about $0.04\mu$ or less, spread across $50\mu$. The step height is a measurement taken from the top or bottom of a surface irregularity to an outlying field or region having no irregularities therein. The thickness of first insulator layer 30 after planarization is typically about $2.0\mu$ but may vary between about $1.5\mu$ and $2.5\mu$ depending on the circuit application. CMP generally causes surface defects 55 such as scratches in top surface 35 of first insulator layer 30. FIGS. 1 and 2 show only one scratch 55 in top surface 35, but it will be understood by those skilled in the art that more than one defect 55 will normally be present.

A curable polymeric material applied onto first insulator layer 30 fills in any defects or scratches 55 found in top surface 35 of first insulator layer 30. The curable polymeric material is then cured by heating to eliminate solvents contained therein and to condense the material to form a polymer, preferably spin-on glass (SOG), for example.

Polymeric film 40 atop first insulator layer 30 remains part of the final three layer dielectric structure and is not removed, in accordance with the invention. The thickness of polymeric film 40 is preferably between about $0.2\mu$ and about $1.0\mu$ and is more preferably about $0.7\mu$ to avoid cracking upon curing.

It is necessary that the polymeric material does not crack during the curing process because such cracking inside polymeric film 40 deteriorates its insulating property. In addition, the polymer chosen must adhere to underlying oxide insulator layer 30. Generally, any curable polymeric material comprising aminosilane provides such adherence and can be cured at the above-mentioned thicknesses without exhibiting film stress and cracking. An aminosilane as used herein is a prepolymer having the general structural formula: $H[NH(CH_2)_x]_m[NH(CH_2)_y]_nSi(OR)_3$, wherein R is alkyl, x and y are integers, m and n are zero or an integer, and $m+n \geq 1$. Suitable SOG's which can be used to form polymeric film 40 are disclosed in U.S. Pat. Nos. 4,723,978 and 4,981,530 and include those prepared from alkylamino trialkoxysilanes such as IBM A1100 and N-2-aminoethylamino propyltrimethoxysilane. These materials are formulated by diluting the aminosilane in an alcoholic solvent, such as methanol, and adding water to the solution. Alternatively, as disclosed in U.S. Pat. No. 5,043,789, a SOG formed by reacting aminoalkoxysilane and arylalkoxysilane monomers and water in methanol may be used. In addition, the SOG chosen can be doped with boron or phosphorous or a combination thereof. However, polymeric film 40 is not limited to being comprised of SOG's prepared from aminosilanes, and other polymers and SOG', including those commercially available, may be used to form film 40 so long as they avoid cracking upon curing and can withstand the curing temperatures employed. Other suitable materials which may be used to form polymeric film 40 will be obvious to those skilled in the art.

Curing of the applied polymeric material is typically done by two separate heat treatments. In the first heat treatment, substrate 20, on which first insulator layer 30 and the curable polymeric material reside, is baked for about 3 to about 10 minutes at a temperature between about 100° and 150° C. driving out solvents and drying the polymeric material. During the second heat treatment, the polymeric material condenses to form the SOG polymer, for example, by annealing for about 30 minutes in an inert $N_2$ atmosphere at a temperature between about 350° C. and about 850° C. Other inert gases, such as argon or helium, may be used to provide an inert atmosphere. The maximum curing temperature available for use in the second heat treatment is dependent on the composition of materials to be heated. For example, when the underlying semiconductor substrate 20 comprises tungsten metallization, a temperature of about 600° C. should be used. Likewise, if semiconductor substrate 20 employs aluminum metal, a temperature of about 350° C. should be used.

A first metal contact hole, or first via 60 is formed and extends vertically from top surface 45 of polymeric film 40 through polymeric film 40 and underlying first insulator layer 30 exposing portion 25 of underlying semiconductor substrate 20. The semiconductor substrate 20 may have an electrically conductive metal coating 90, such as tungsten, aluminum, or an alloy of titanium and tungsten, thereon as shown in FIG. 2. Therefore, first via 60 may expose portion 25 of electrically conductive metal coating 90 to provide a contact point for subsequent electrical connection with a first metallization layer, M1 patterned in semiconductor substrate 20. If there is no conductive metal coating 90, as shown in FIG. 1, then first via 60 exposes portion 25 of the semiconductor material providing a contact point with doped or undoped silicon, for example.

Typically, first via 60 is defined using conventional methods of photolithographic patterning and etching, as with a photoresist followed by reactive ion etching, for example. The diameter of first via 60 is typically about $1.0\mu$. Although only one first via 60 is shown in FIGS. 1 and 2 and its formation described herein, typically more than one first via 60 would concurrently be formed in the structure, as would be understood by those skilled in the art. The present invention relates to a preferred embodiment in which at least one first via 60 is formed.

A conductive metal is deposited onto top surface 45 of polymeric film 40, typically by chemical vapor deposition if the metal is tungsten or an alloy thereof, or by sputtering if the metal is aluminum. The deposited metal completely fills first via 60 forming metal interconnection stud 65 which contacts the exposed portion 25 of semiconductor substrate 20, typically electrically connecting with first metallization level, M1. Thus, as shown in FIG. 2, where semiconductor substrate 20 has electrically conductive metal coating 90 thereon, a metal-metal connection may be made between metal interconnection stud 65 and conductive metal coating 90 through exposed portion 25. Alternatively, a metal-semiconductor connection between metal interconnection stud 65 and the semiconductor material of exposed portion 25 may be made as shown in FIG. 1.

The metal of stud 65 also contacts polymeric film 40 and first insulator layer 30, but no metal reaches defects 55 in the surface of first insulator layer 30. The advantage obtained by adding polymeric film 40 to fill defects 55 and become part of the interlayer dielectric structure is apparent at this point. That is, according to the present invention, surface defects 55 produced in surface 35 of first insulator layer 30 by CMP are filled with the polymer and not with the conductive metal upon deposition thereof. Thus, short circuits within the interlevel dielectric between the metal-filled defects 55 vias and metal interconnection studs 65, which are currently encountered in the microelectronics manufacturing process, are greatly reduced by the method and structure of the present invention.

The conductive metal deposited over polymeric film 40 and into first via 60 is electrically conducting and may be comprised of aluminum, tungsten, or titanium nitride/tungsten, for example, and will vary depending on the circuit application. Other conductive metals may be used and will be obvious to those skilled in the art which metals are suitable.

Planarizing the deposited conductive metal, typically by chemical-mechanical-polishing (CMP), removes the metal from polymeric film 40, thereby exposing top surface 45. First via 60 remains filled with the conductive metal, and the CMP planarization terminates metal interconnection stud 65 to form end 70 planar with top surface 45 of polymeric film 40. End 70 of metal interconnection stud 65 forms a horizontal metal pad which is available for electrical connection with a subsequently fabricated metallization layer M2 disposed above metallization layer M1 of semiconductor substrate 20. Where more than one first via 60 is formed, more than one metal interconnection stud 65 corresponding to each first via 60 will also be formed, and each metal interconnection stud 65 will have a corresponding stud end 70.

An insulating material, which forms second insulator layer 50, is deposited onto top surface 45 of polymeric film 40 and onto end 70 of stud 65. Like first insulator layer 30, the insulating material that comprises second insulator layer 50 is typically an oxide which has a low dielectric constant and withstands high temperatures. Typical insulating materials are silicon dioxide, which may or may not be doped with boron, phosphorous or a combination thereof, silicon nitride, or polyimides depending on the semiconductor device metallurgy and the desired dielectric constant. Second insulator layer 50 is deposited to a thickness of between about $0.7\mu$ to about $1.1\mu$ with $0.9\mu$ being preferable.

Second via 80 is formed by removing a portion of second insulator layer 50 directly overlying metal interconnection stud end 70. Typically, second via 80 is defined and etched, using a commonly known photolithography/etch process, and extends through second insulator layer 50 preferably exposing only end 70 of metal interconnection stud 65. That is, second via area 80 is preferably fully landed on underlying end 70 of stud 65, such that none of polymeric film 40 is exposed. Thus, the diameter of second via area 80 is generally smaller than that of first via area 60 as shown in FIGS. 1 and 2. A diameter of between about $0.8\mu$ is generally used where the diameter of the first via 60 is about $1.0\mu$. Such a configuration prevents out-gassing of any polymeric solvents which would contaminate second via area 80 and affect the electrical conductivity of any metals deposited therein. Typically, if there is more than one metal interconnection stud 65 and end 70, more than one second via 80 will also be formed. Each second via 80 will expose a metal interconnection stud end 70 with which it will correspond.

Second via 80 is available for deposition of a second conductive metal to provide electrical connection with exposed portion 25 of substrate 20, which may be a semiconductor or a conductive metal, through end 70 of metal interconnection stud 65.

Where first metallization level, M1 is located within the semiconductor substrate 20, connection is made between M1 and the next level of metallization, M2, which will be deposed over second insulator layer 50. Thus, the resulting three layer interlevel dielectric structure comprising first insulator layer 30, polymeric film 40, and second insulator layer 50 functions as an intermetal dielectric layer separating metallization levels M1 and M2.

The invention also comprises the completed semiconductor structure which may be manufactured by the method of the present invention described above and is shown in FIGS. 1 and 2.

Advantages afforded by the method and the three layer dielectric structure of the present invention include an increase in microelectronic product yield due to the reduction in short circuits within interlevel dielectrics. Therefore, CMP can be used by manufacturers to planarize the dielectric layer overlying the semiconductor substrate without the associated shorting problems caused when metal is subsequently deposited thereon. The method of the present invention is simple because a second polishing step need not be employed to remove metal-filled defects in the first insulator layer. In addition, the polymeric film remains part of the interlayer dielectric structure and need not be removed. Finally, the method and structure of the present invention are economical because large amounts of costly sacrificial dielectric material need not be deposited to perform a second polishing step.

While the invention has been particularly shown and described with reference to the preferred embodiments thereof, it will be understood by those skilled in the art that other changes in form and details may be made therein without departing from the spirit and scope of the invention.

We claim:

1. A method of manufacturing a semiconductor device comprising the steps of:

(a) providing a semiconductor substrate having thereon a planarized first insulator layer, and on said first insulator layer a polymeric film having a top surface;

(b) forming a first via extending vertically from said top surface of said polymeric film through said polymeric film and said first insulator layer to expose a portion of said semiconductor substrate;

(c) depositing and planarizing a conductive metal in said first via to form a metal interconnection stud having an end planar with said top surface of said polymeric film;

(d) depositing a second insulator material over said polymeric film and said metal interconnection stud end to form a second insulator layer; and (e) removing a portion of said second insulator layer directly overlying said metal interconnection stud end to form a second via extending through said second insulator layer to said stud end.

2. The method according to claim 1, wherein said semiconductor substrate includes an electrically conductive metal coating thereon and a first metallization level, M1, said conductive metal coating providing electrical connection between said metal interconnection stud and said first metallization level, M1.

3. The method according to claim 1, wherein said top surface of said first insulator layer has at least one surface defect therein.

4. The method according to claim 1, wherein said first insulator material is selected from the group consisting of silicon dioxide, boron-doped silicon dioxide, phosphorous-doped silicon dioxide, polyimide, and silicon nitride.

5. The method according to claim 1, wherein said polymeric film comprises spin-on glass.

6. The method according to claim 1, wherein said polymeric film is formed by depositing aminosilane and heating to form a glass.

7. The method according to claim 1, wherein said conductive metal is selected from the group consisting of tungsten, aluminum, and titanium nitride/tungsten.

8. The method according to claim 1, wherein said second insulator material is selected from the group consisting of silicon dioxide, boron-doped silicon dioxide, and phosphorous-doped silicon dioxide, polyimides, and silicon nitride.

9. The method according to claim 1, wherein said second via exposes only said metal interconnection stud end.

* * * * *

UNITED STATES PATENT AND TRADEMARK OFFICE
CERTIFICATE OF CORRECTION

PATENT NO. : 5,804,503
DATED : September 08, 1998
INVENTOR(S) : Leidy et al.

It is certified that error appears in the above-identified patent and that said Letters Patent is hereby corrected as shown below:

On the title page:
Item [75] Inventors:

After "Jon A. Patrick, Jeffersonville,", please insert --Rosemary Ann Previti-Kelly, Richmond,--.

Signed and Sealed this

Twenty-sixth Day of January, 1999

Attest:

*Acting Commissioner of Patents and Trademarks*

Attesting Officer